(12) United States Patent
  Matsushita

(10) Patent No.: US 10,432,106 B2
(45) Date of Patent: Oct. 1, 2019

(54) POWER CONVERSION DEVICE

(71) Applicant: Mitsubishi Electric Corporation, Tokyo (JP)

(72) Inventor: Shinya Matsushita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/771,115

(22) PCT Filed: Jan. 21, 2016

(86) PCT No.: PCT/JP2016/051730
  § 371 (c)(1),
  (2) Date: Apr. 27, 2018

(87) PCT Pub. No.: WO2017/126086
  PCT Pub. Date: Jul. 27, 2017

(65) Prior Publication Data
  US 2018/0316274 A1    Nov. 1, 2018

(51) Int. Cl.
  *H02M 5/458*    (2006.01)
  *H02M 7/44*    (2006.01)
  (Continued)

(52) U.S. Cl.
  CPC ............ *H02M 5/458* (2013.01); *H01R 11/01* (2013.01); *H02M 7/003* (2013.01); *H02M 7/44* (2013.01);
  (Continued)

(58) Field of Classification Search
  CPC ...... H02M 5/458; H02M 5/4585; H02M 7/44; H02M 7/003; H02M 7/062; H05K 3/20; H05K 7/06; H05K 3/32; H01R 11/01
  See application file for complete search history.

(56) References Cited

U.S. PATENT DOCUMENTS 4,603,930 A * 8/1986 Ito .......................... H01R 23/68
                                                                     361/752
7,154,761 B1    12/2006 Camerlo et al.
(Continued)

FOREIGN PATENT DOCUMENTS

JP    S63-122296 A    5/1988
JP    S63-152262 U1    10/1988
(Continued)

OTHER PUBLICATIONS

International Search Report of the International Searching Authority dated Apr. 26, 2016 for the corresponding international application No. PCT/JP2016/051730 (and English translation).
(Continued)

*Primary Examiner* — Adolf D Berhane
*Assistant Examiner* — Sisay G Tiku
(74) *Attorney, Agent, or Firm* — Posz Law Group, PLC

(57) ABSTRACT

A power conversion device includes a printed wiring board on which an alternating-current power-supply input part, a converter circuit part to convert alternating-current power to direct-current power, an inverter circuit part to convert direct-current power converted by the converter circuit part to alternating-current power, an alternating-current power-supply output part to output alternating-current power converted by the inverter circuit part, and a conductive pattern to electrically connect the alternating-current power-supply input part, the converter circuit part, the inverter circuit part, and the alternating-current power-supply output part to one another are provided, and a busbar that has a plate-like shape with a plane direction thereof perpendicular to a plane direction of the printed wiring board, is arranged to overlap the conductive pattern in plan view, and includes two or more connecting portions that are in contact with the conductive pattern.

12 Claims, 4 Drawing Sheets

(51) Int. Cl.
*H02M 7/00* (2006.01)
*H02M 7/06* (2006.01)
*H05K 7/06* (2006.01)
*H05K 3/32* (2006.01)
*H05K 3/20* (2006.01)
*H01R 11/01* (2006.01)
*H05K 1/02* (2006.01)
*H05K 1/18* (2006.01)
*H05K 3/22* (2006.01)

(52) U.S. Cl.
CPC .......... *H05K 1/0263* (2013.01); *H05K 1/184* (2013.01); *H05K 3/20* (2013.01); *H05K 3/32* (2013.01); *H05K 7/06* (2013.01); *H05K 3/222* (2013.01); *H05K 2201/10272* (2013.01)

(56) References Cited

U.S. PATENT DOCUMENTS

| | | | |
|---|---|---|---|
| 2004/0223310 A1 | 11/2004 | Toyomura | |
| 2005/0265059 A1 | 12/2005 | Tracy et al. | |
| 2006/0050494 A1 | 3/2006 | Chen | |
| 2006/0227254 A1* | 10/2006 | Kato | F21V 23/026 |
| | | | 348/836 |
| 2010/0020516 A1* | 1/2010 | Kishino | H05K 1/144 |
| | | | 361/803 |
| 2011/0221268 A1* | 9/2011 | Kanazawa | H05K 1/0263 |
| | | | 307/10.1 |
| 2017/0033593 A1* | 2/2017 | Kamizuma | H02M 7/217 |
| 2017/0040906 A1* | 2/2017 | Hattori | H02M 7/48 |

FOREIGN PATENT DOCUMENTS

| | | | |
|---|---|---|---|
| JP | 2003-125587 | * | 4/2003 |
| JP | 2004-335887 A | | 11/2004 |
| JP | 2005-341641 | * | 8/2005 |
| JP | 2005-341641 A | | 12/2005 |
| JP | 2011-036017 A | | 2/2011 |
| JP | 2014-236564 A | | 12/2014 |
| WO | WO2012-067096 | * | 11/2011 |
| WO | 2012/067096 A1 | | 5/2012 |
| WO | 2016002018 A1 | | 1/2016 |

OTHER PUBLICATIONS

Office Action dated Dec. 11, 2018 issued in corresponding JP patent application No. 2017-562236 (and English translation).

Office Action dated Aug. 21, 2018 issued in corresponding JP patent application No. 2017-562236 (and English translation).

Extended European Search Report dated Jan. 7, 2019 issued in corresponding EP patent application No. 16886327.2.

Office Action dated Jun. 26, 2019 issued in corresponding EP patent application No. 16886327.2.

\* cited by examiner

POWER CONVERSION DEVICE

CROSS REFERENCE TO RELATED APPLICATION

This application is a U.S. national stage application of International Patent Application No. PCT/JP2016/051730 filed on Jan. 21, 2016, the disclosure of which is incorporated herein by reference.

TECHNICAL FIELD

The present invention relates to a power conversion device in which a converter circuit part and an inverter circuit part are provided on a printed wiring board.

BACKGROUND

Patent Literature 1 discloses a configuration of a power conversion device in which a busbar extending in a thickness direction of a printed wiring board is provided on the printed wiring board as a wiring member, in place of a conductive pattern, as measures against heat generation that occurs when a current is made to flow in the printed wiring board. By providing the busbar as a wiring member, a current-carrying capacity is increased as compared with a case of providing a conductive pattern, so that a temperature increase when a current is made to flow is suppressed.

PATENT LITERATURE

Patent Literature 1: Japanese Patent Application Laid-open No. 2014-236564

However, the conventional technique described above has a problem that the busbar has to be made larger in order to increase the current-carrying capacity because a current flows through the busbar only, and cost is inevitably increased.

Further, in a case of using a common printed wiring board in a plurality of models that are different from one another in current-carrying capacity, it is necessary to provide a busbar even in a model of which a current-carrying capacity is small, because the busbar is used as a wiring member. Therefore, cost is inevitably increased because of mounting of an unnecessary component.

SUMMARY

The present invention has been achieved in view of the above problems, and an object of the present invention is to provide a power conversion device that can suppress cost by employing a configuration corresponding to a required current-carrying capacity.

In order to solve the above-mentioned problems and achieve the object, the present invention provides a power conversion device including: a printed wiring board on which an alternating-current power-supply input part to which alternating-current power is input, a converter circuit part to convert alternating-current power input to the alternating-current power-supply input part to direct-current power, an inverter circuit part to convert direct-current power converted by the converter circuit part to alternating-current power, an alternating-current power-supply output part to output alternating-current power converted by the inverter circuit part, and a conductive pattern to electrically connect the alternating-current power-supply input part, the converter circuit part, the inverter circuit part, and the alternating-current power-supply output part to one another are provided; and a busbar that has a plate-like shape with a plane direction thereof perpendicular to a plane direction of the printed wiring board, is arranged to overlap the conductive pattern in plan view, and includes two or more connecting portions that are in contact with the conductive pattern.

The power conversion device according to the present invention has an effect where it is possible to suppress cost by employing a configuration corresponding to a required current-carrying capacity.

DETAILED DESCRIPTION

A power conversion device according to embodiments of the present invention will be described in detail below with reference to the accompanying drawings. The present invention is not limited to the embodiments.

First Embodiment

Figure 1:
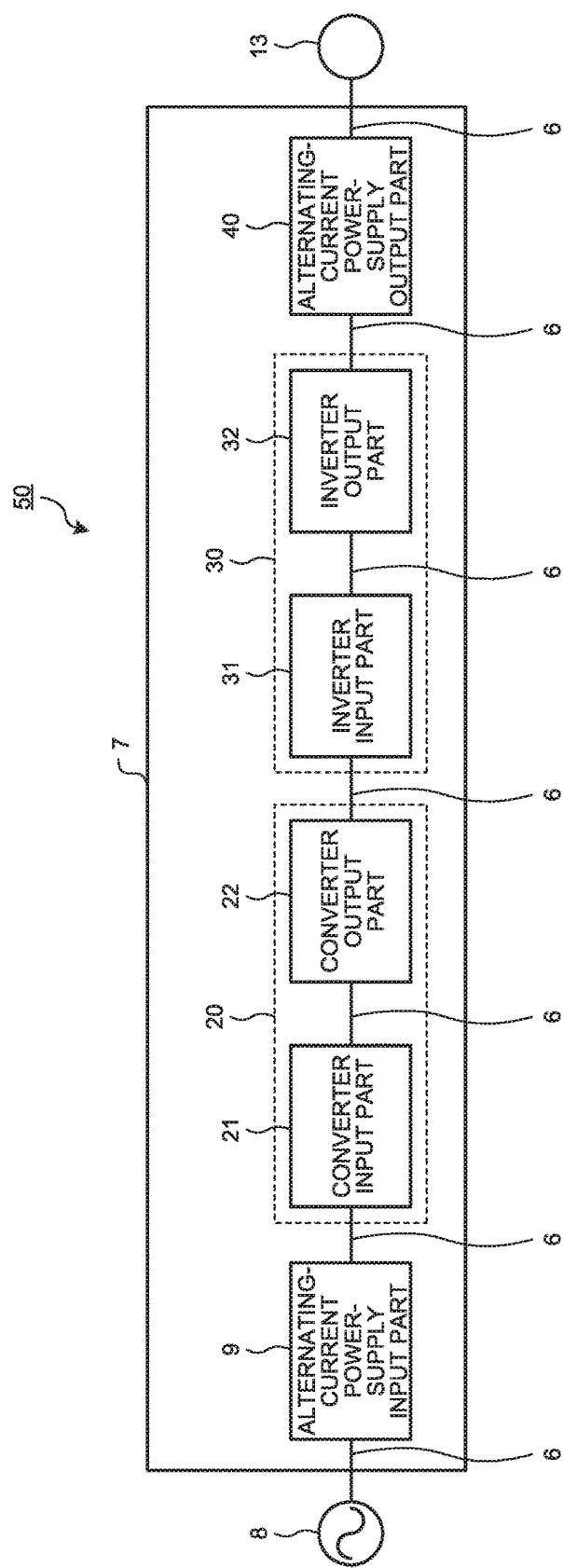
FIG. 1 is a diagram illustrating a schematic configuration of a power conversion device according to a first embodiment of the present invention.

FIG. 1 is a diagram illustrating a schematic configuration of a power conversion device according to a first embodiment of the present invention. A power conversion device 50 is constituted by an alternating-current power-supply input part 9, a converter circuit part 20, an inverter circuit part 30, and an alternating-current power-supply output part 40 that are mounted on a printed wiring board 7. A conductive pattern 6 formed on the printed wiring board 7 electrically connects the alternating-current power-supply input part 9 and the converter circuit part 20 to each other, the converter circuit part 20 and the inverter circuit part 30 to each other, and the inverter circuit part 30 and the alternating-current power-supply output part 40 to each other.

The power conversion device 50 converts alternating-current power supplied from an alternating-current power supply 8 to direct-current power, converts again the direct-current power to alternating-current power with an arbitrary frequency and an arbitrary voltage, and supplies the resultant alternating-current power to a dynamic-power part 13. The dynamic-power part 13 is an electric motor, for example.

Respective power conversion are performed by cooperation of the alternating-current power-supply input part 9, the converter circuit part 20, the inverter circuit part 30, and the alternating-current power-supply output part 40 that are mounted on the printed wiring board 7 with one another.

That is, in the alternating-current power-supply input part 9, alternating-current power supplied from the alternating-current power supply 8 is output to the converter circuit part 20 via the conductive pattern 6. The converter circuit part 20 performs three-phase full-wave rectification on the alternating-current power by a diode bridge, thereby converting the alternating-current power to a direct-current voltage. The converter circuit part 20 has a converter input part 21 and a converter output part 22. The converter input part 21 and the converter output part 22 are electrically connected to each other by the conductive pattern 6 formed on the printed wiring board 7. The alternating-current power transmitted from the alternating-current power-supply input part 9 via the conductive pattern 6 is input to the converter input part 21 and is converted to direct-current power in the converter circuit part 20. The resultant direct-current power is output from the converter output part 22 to the inverter circuit part 30 via the conductive pattern 6.

The inverter circuit part 30 converts direct-current power to alternating-current power by a switching operation of a switching element. The inverter circuit part 30 has an inverter input part 31 and an inverter output part 32. The inverter input part 31 and the inverter output part 32 are electrically connected to each other by the conductive pattern 6 formed on the printed wiring board 7. The direct-current power output from the converter output part 22 is input to the inverter input part 31 and is converted to alternating-current power with an arbitrary frequency and an arbitrary voltage in the inverter circuit part 30. The resultant alternating-current power is output from the inverter output part 32 to the alternating-current power-supply output part 40 via the conductive pattern 6.

In the alternating-current power-supply output part 40, the alternating-current power output from the inverter output part 32 is output to the dynamic-power part 13. The dynamic-power part 13 converts the alternating-current power output from the alternating-current power-supply output part 40 to dynamic power.

Figure 2:
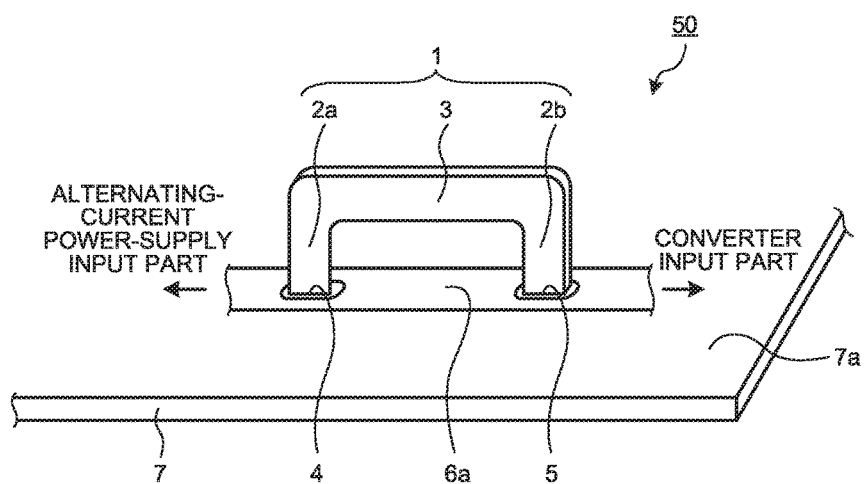
FIG. 2 is a partially enlarged perspective view of the power conversion device according to the first embodiment.
Figure 3:
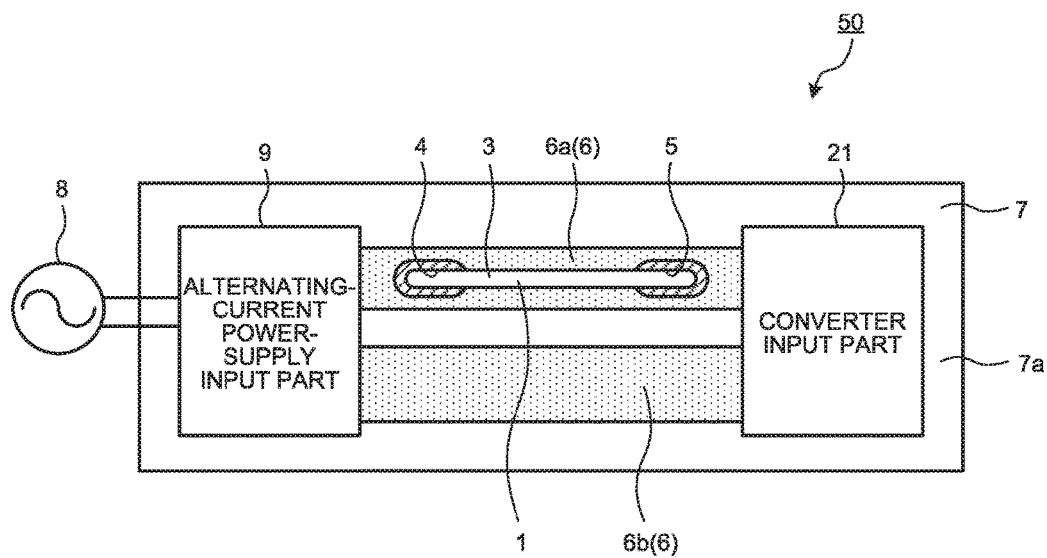
FIG. 3 is a partially enlarged plan view of the power conversion device according to the first embodiment.
Figure 4:
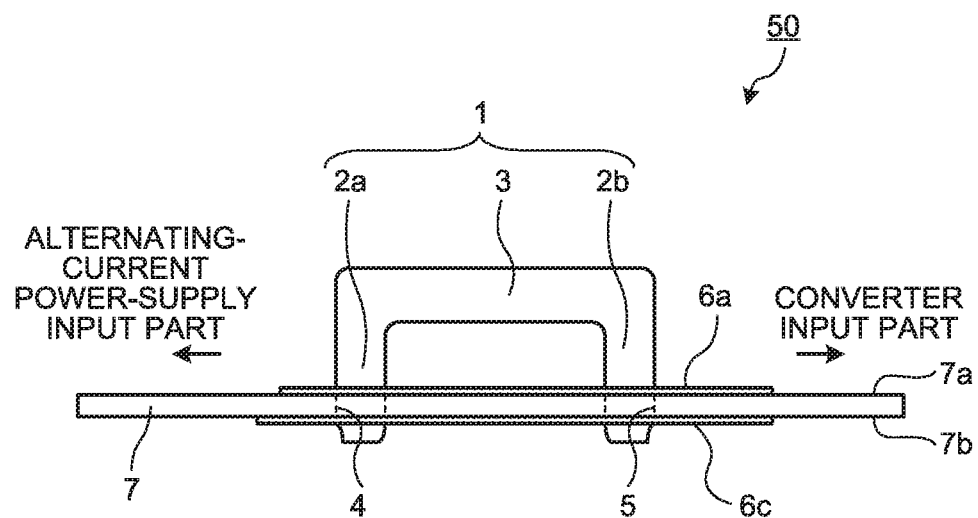
FIG. 4 is a partially enlarged front view of the power conversion device according to the first embodiment.
Figure 5:
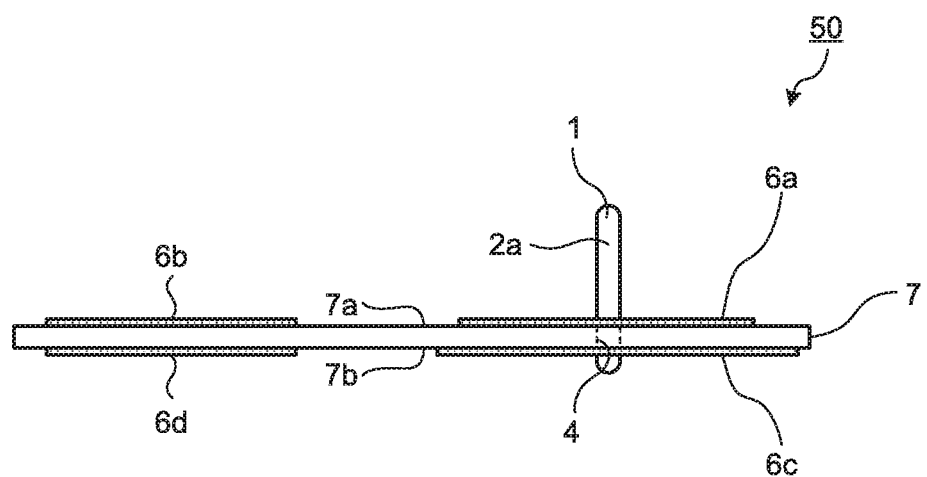
FIG. 5 is a partially enlarged side view of the power conversion device according to the first embodiment.

The conductive pattern 6 formed on the printed wiring board 7 in the power conversion device 50 configured in the above manner is described. FIG. 2 is a partially enlarged perspective view of the power conversion device 50 according to the first embodiment. FIG. 3 is a partially enlarged plan view of the power conversion device 50 according to the first embodiment. FIG. 4 is a partially enlarged front view of the power conversion device 50 according to the first embodiment. FIG. 5 is a partially enlarged side view of the power conversion device 50 according to the first embodiment. In FIGS. 2 to 5, a portion between the alternating-current power-supply input part 9 and the converter input part 21 is illustrated in an enlarged manner.

A busbar 1 is mounted on the printed wiring board 7. The busbar 1 is arranged to overlap the conductive pattern 6 in plan view, as illustrated in FIG. 3. The busbar 1 has a first leg portion 2a and a second leg portion 2b that are respectively inserted into through holes 4 and 5 formed in the conductive pattern 6 of the printed wiring board 7 and are fixed to the printed wiring board 7 by soldering. The busbar 1 also has a main body portion 3 connecting the first leg portion 2a and the second leg portion 2b to each other. The first leg portion 2a and the second leg portion 2b are in contact with the conductive pattern 6, thereby serving as connecting portions that electrically connect the busbar 1 to the conductive pattern 6. Three or more connecting portions that are in contact with the conductive pattern 6 can be provided for one busbar 1.

Each of the main body portion 3, the first leg portion 2a, and the second leg portion 2b is formed to have a shape of a rectangular or quadrangular plate. The first leg portion 2a and the second leg portion 2b are connected to each other by the main body portion 3, so that the busbar 1 is in the form of a U-shaped plate as a whole, as illustrated in FIG. 4. The busbar 1 is mounted to form a space between the main body portion 3 and the printed wiring board 7. Further, the busbar 1 is arranged in such a manner that a plane direction thereof is perpendicular to a plane direction of the printed wiring board 7.

Each of the main body portion 3, the first leg portion 2a, and the second leg portion 2b is configured in such a manner that a height dimension is sufficiently larger than a thickness dimension. In FIGS. 2 to 5, the busbar 1 is connected to the conductive pattern 6 between the alternating-current power-supply input part 9 and the converter input part 21. Further, the busbar 1 is arranged to be parallel to the conductive pattern 6.

The conductive pattern 6 can be formed on a component surface 7a of the printed wiring board 7, on which the converter circuit part 20 and the like are mounted, or on a soldering surface 7b that is a back surface of the component surface 7a, or on both the component surface 7a and the soldering surface 7b. An example in which the conductive pattern 6 (6a, 6b, 6c, and 6d) is formed on both the component surface 7a and the soldering surface 7b is illustrated in the first embodiment. Further, the busbar 1 can be arranged on the conductive pattern 6 on either one of a positive side and a negative side of an alternating-current voltage, or on the conductive pattern 6 on both the positive side and the negative side. Furthermore, the busbar 1 can be arranged on the conductive pattern 6 formed on the component surface 7a or the conductive pattern 6 formed on the soldering surface 7b. That is, although the busbar 1 is arranged on the positive-side conductive pattern 6a of the conductive pattern 6, which is formed on the component surface 7a, in the present embodiment, the negative-side conductive pattern 6b formed on the component surface 7a, the positive-side conductive pattern 6c formed on the soldering surface 7b, and the negative-side conductive pattern 6d formed on the soldering surface 7b can respectively be the object on which the busbar 1 is arranged.

Although the busbar 1 is arranged to overlap the conductive pattern 6 between the alternating-current power-supply input part 9 and the converter input part 21 in the first embodiment, the busbar 1 can be arranged to overlap another conductive pattern 6. That is, the busbar 1 can be arranged to overlap the conductive pattern 6 between the converter circuit part 20 and the inverter circuit part 30, the conductive pattern 6 between the converter input part 21 and the converter output part 22, the conductive pattern 6 between the inverter input part 31 and the inverter output part 32, or the conductive pattern 6 between the inverter output part 32 and the alternating-current power-supply output part 40.

As described above, in the power conversion device 50 according to the first embodiment, the busbar 1 is connected to the conductive pattern 6 between the alternating-current power-supply input part 9 and the converter input part 21 through which a large current flows. Therefore, the current flowing through the conductive pattern 6 can be split in such a manner that a portion thereof flows to the side of the busbar 1. Accordingly, the current flowing through the conductive pattern 6 can be reduced, and heat dissipation from the busbar 1 can be expected. Therefore, it is possible to suppress a temperature increase in the conductive pattern 6. Further, because heat dissipation from the conductive pattern 6 can be also expected, it is possible to use a busbar 1 that is smaller than in a case where a current is made to flow through the busbar 1 only. Furthermore, because a portion of the current is split and flows to the busbar 1, the conductive pattern 6 can be made finer. Therefore, downsizing of the printed wiring board 7, that is, downsizing of the power conversion device 50 can be achieved.

In addition, because the busbar 1 is configured in such a manner that a height dimension is sufficiently larger than a thickness dimension, a mounting area of the printed wiring board 7 can be increased. Further, also in a case of increasing the size of the busbar 1 in order to improve cooling performance, it suffices that the size of the busbar 1 is increased in a height direction. Therefore, it is possible to change the size of the busbar 1 without increasing the mounting area of the printed wiring board 7.

Further, in a case where a large current-carrying capacity is required in the power conversion device 50, such a large current-carrying capacity can be achieved by increasing the size of the busbar 1. In a case where only a small current-carrying capacity is required in the power conversion device 50, it is possible to employ a configuration in which the busbar 1 is not provided, because power is supplied from the alternating-current power-supply input part 9 to the converter input part 21 via the conductive pattern 6. Furthermore, because power is supplied from the alternating-current power-supply input part 9 to the converter input part 21 via the conductive pattern 6 as described above, downsizing of the busbar 1 can be achieved as compared with a case where power is supplied by the busbar 1 only. As described above, in the power conversion device 50 according to the first embodiment, it is possible to suppress cost by employing a configuration corresponding to a required current-carrying capacity.

As illustrated in FIG. 5, a thickness dimension of the busbar 1 is smaller than a width dimension of the conductive pattern 6 with which the busbar 1 is in contact. Because the busbar 1 is arranged in such a manner that the thickness dimension thereof is smaller than the width dimension of the conductive pattern 6, the busbar 1 does not protrude from a region on the conductive pattern 6, and it is possible to add the busbar 1 without increasing the mounting area of the printed wiring board 7. Furthermore, also in a case where the printed wiring board 7 is used in common by a plurality of models, it is possible to choose a specification in which the busbar 1 is mounted or a specification in which the busbar 1 is not mounted without influencing the mounting area of the printed wiring board 7 by arranging the busbar 1 in the manner described above.

Further, the busbar 1 is arranged to overlap the conductive pattern 6 arranged in the converter input part 21. Therefore, also in a case where the converter circuit part 20 is modularized and the density of a portion around its input terminal is made high, it is possible to establish connection by using a fine conductive pattern 6.

Second Embodiment

Figure 6:
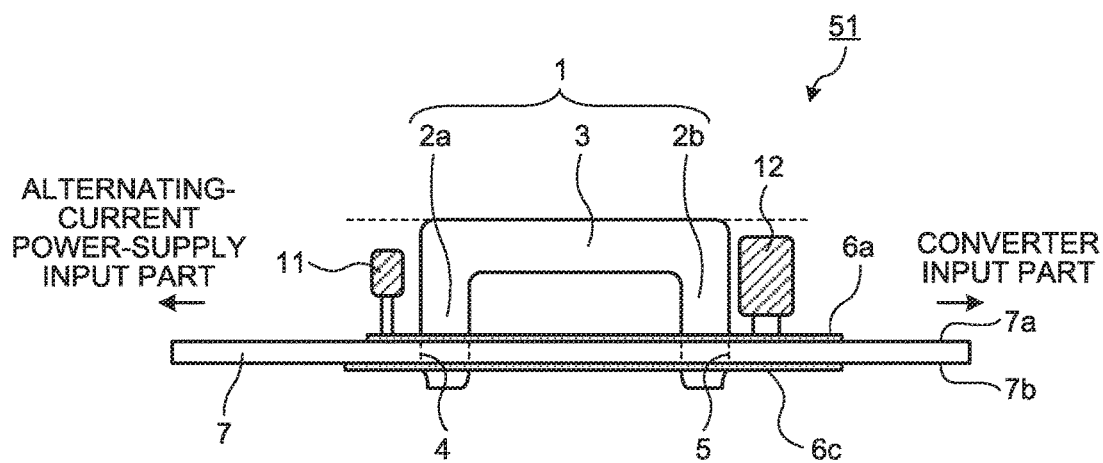
FIG. 6 is a partially enlarged front view of a power conversion device according to a second embodiment of the present invention.
Figure 7:
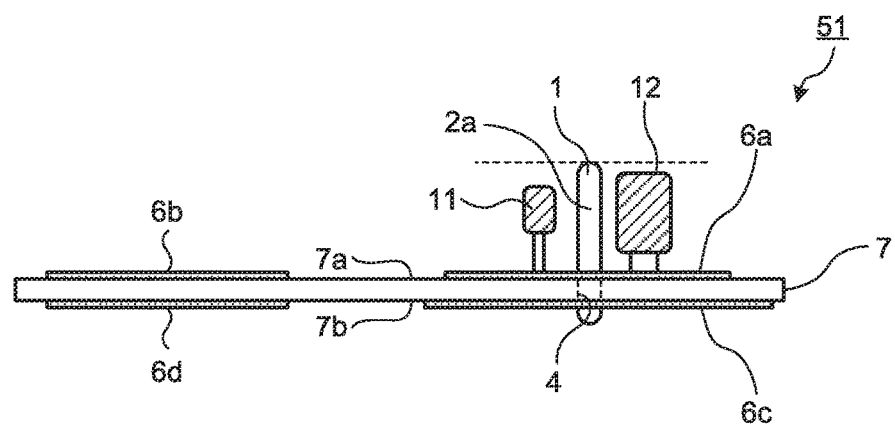
FIG. 7 is a partially enlarged side view of the power conversion device according to the second embodiment.

FIG. 6 is a partially enlarged front view of a power conversion device 51 according to a second embodiment of the present invention. FIG. 7 is a partially enlarged side view of the power conversion device 51 according to the second embodiment. Constituent elements identical to those of the first embodiment are denoted by like reference signs and redundant explanations thereof will be omitted.

As illustrated in FIGS. 6 and 7, the power conversion device 51 according to the second embodiment is configured in such a manner that a height dimension of the busbar 1 is higher than height dimensions of electronic components 11 and 12 arranged on a surface of the printed wiring board 7, on which the busbar 1 is mounted. A distance between the main body portion 3 of the busbar 1 and the printed wiring board 7 can be higher or lower than the height dimensions of the electronic components 11 and 12.

As described above, by setting the height dimension of the busbar 1 to be larger than the height dimensions of the electronic components 11 and 12, flow of an air cooling the busbar 1 becomes less likely to be interfered. In a case where the printed wiring board 7 is forcibly cooled by causing a cooling air from a blower to blow thereto, the cooling air can hit the busbar 1 more easily. Therefore, a cooling capacity can be improved. Further, also in a case where forcible cooling by using a blower is not performed, it is possible to reduce an influence of heat radiated from the busbar 1 on the electronic components 11 and 12 around the busbar 1. Therefore, it is possible to suppress a temperature increase of the electronic components. A cooling capacity of a busbar can be improved by setting the height dimension of the busbar 1 to be larger than the height dimension of at least a closest electronic component to the busbar 1, of the electronic components 11 and 12.

The configurations described in the above embodiments are only examples of the content of the present invention. The configurations can be combined with other well-known techniques, and a part of each configuration can be omitted or modified without departing from the scope of the present invention.

The invention claimed is:

1. A power conversion device comprising:
a printed wiring board on which an alternating-current power-supply input circuit to which alternating-current power is input, a converter circuit to convert alternating-current power input to the alternating-current power-supply input circuit to direct-current power, an inverter circuit to convert direct-current power converted by the converter circuit to alternating-current power, an alternating-current power-supply output circuit to output alternating-current power converted by the inverter circuit, and a conductive pattern to electrically connect the alternating-current power-supply input circuit, the converter circuit, the inverter circuit, and the alternating-current power-supply output circuit to one another are provided; and
a flat busbar that has a plate-like shape with a first plane direction thereof perpendicular to a second plane direction of the conductive pattern, is arranged to overlap the conductive pattern in plan view, and includes two or more connecting portions that are in direct electrical contact with the conductive pattern,
wherein the conductive pattern is a flat pattern formed in the second plane direction.

2. The power conversion device according to claim 1, wherein a thickness of the printed wiring board is smaller than a width of the conductive pattern with which the two connecting portions are in contact.

3. The power conversion device according to claim 2, wherein the connecting portions of the busbar are in contact with a the conductive pattern between the converter circuit and the inverter circuit.

4. The power conversion device according to claim 2, wherein the connecting portions of the busbar are in contact with a the conductive pattern between the inverter circuit and the alternating-current power-supply output circuit.

5. The power conversion device according to claim 1, further comprising electronic components provided on a surface of the printed wiring board, on which the busbar is arranged, wherein a height dimension of the busbar is higher than a height dimension of an electronic component that is closest to the busbar.

6. The power conversion device according to claim 5, wherein the connecting portions of the busbar are in contact with a the conductive pattern between the converter circuit and the inverter circuit.

7. The power conversion device according to claim 5, wherein the connecting portions of the busbar are in contact with a the conductive pattern between the inverter circuit and the alternating-current power-supply output circuit.

8. The power conversion device according to claim 1, wherein the connecting portions of the busbar are in contact with a the conductive pattern between the converter circuit and the inverter circuit.

9. The power conversion device according to claim 1, wherein the connecting portions of the busbar are in contact with a the conductive pattern between the inverter circuit and the alternating-current power-supply output circuit.

10. The power conversion device according to claim 1, wherein the busbar is a flat U-shape formed in the first plane direction, having a main portion, a first portion, and a second portion, the main portion, the first portion, and the second portion are all formed in the first plane direction, the first and second portions are connected to the main portion and each extend outward from the main portion in a same direction, the first portion is electrically connected to the conductive pattern at a first connection point, and the second portion is electrically connected to the conductive pattern at a second connection point.

11. The power conversion device according to claim 10, wherein the conductive pattern extends on the printed wiring board between the first connection point and the second connection point, and the main portion of the busbar runs between the first and second portions parallel to the conductive pattern.

12. The power conversion device according to claim 1, wherein the conductive pattern is in direct electrical contact with the alternating-current power-supply input circuit, the converter circuit, the inverter circuit, and the alternating-current power-supply output circuit.

* * * * *